(12) United States Patent
Asai et al.

(10) Patent No.: US 10,304,653 B2
(45) Date of Patent: May 28, 2019

(54) ION MILLING DEVICE, ION SOURCE AND ION MILLING METHOD

(71) Applicant: Hitachi High-Technologies Corporation, Minato-ku, Tokyo (JP)

(72) Inventors: Kengo Asai, Tokyo (JP); Hiroyasu Shichi, Tokyo (JP); Hisayuki Takasu, Tokyo (JP); Toru Iwaya, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/500,449

(22) PCT Filed: Jul. 29, 2015

(86) PCT No.: PCT/JP2015/071433
§ 371 (c)(1),
(2) Date: Jan. 30, 2017

(87) PCT Pub. No.: WO2016/017661
PCT Pub. Date: Feb. 4, 2016

(65) Prior Publication Data
US 2017/0221671 A1 Aug. 3, 2017

(30) Foreign Application Priority Data
Jul. 30, 2014 (JP) ................. 2014-154424

(51) Int. Cl.
*H01J 37/08* (2006.01)
*H01J 37/30* (2006.01)
(Continued)

(52) U.S. Cl.
CPC .............. *H01J 37/08* (2013.01); *H01J 27/04* (2013.01); *H01J 37/30* (2013.01); *H01J 37/305* (2013.01);
(Continued)

(58) Field of Classification Search
CPC ............................. H01J 37/08; H01J 37/3071
See application file for complete search history.

(56) References Cited

U.S. PATENT DOCUMENTS 4,423,355 A 12/1983 Kageyama
7,619,224 B2 * 11/2009 Chen ........................ G21K 5/04
250/396 ML
(Continued)

FOREIGN PATENT DOCUMENTS

JP 2000-355764 A 12/2000
JP 2006-351374 A1 12/2006
(Continued)

OTHER PUBLICATIONS

Translation to Shidouji (JP 2000-355764 as cited on IDS) published Dec. 2000. (Year: 2000).*
(Continued)

*Primary Examiner* — John J Brayton
(74) *Attorney, Agent, or Firm* — Miles & Stockbridge P.C.

(57) ABSTRACT

To provide an ion gun of a penning discharge type capable of achieving a milling rate which is remarkably higher than that in the related art, an ion milling device including the same, and an ion milling method.

An ion generation unit includes a cathode that emits electrons, an anode that is provided within the ion generation unit and has an inner diameter of 5.2 mm or less, and magnetic-field generation means using a permanent magnet of which a maximum energy product ranges from 110 kJ/m$^3$ to 191 kJ/m$^3$.

20 Claims, 10 Drawing Sheets

(51) Int. Cl.
*H01J 37/305* (2006.01)
*H01J 27/04* (2006.01)

(52) U.S. Cl.
CPC ... *H01J 2237/081* (2013.01); *H01J 2237/082* (2013.01); *H01J 2237/303* (2013.01)

(56) References Cited

U.S. PATENT DOCUMENTS

| | | | |
|---|---|---|---|
| 2005/0232320 A1* | 10/2005 | Tateno | C30B 29/28 372/39 |
| 2006/0076510 A1 | 4/2006 | Chang et al. | |
| 2006/0284105 A1 | 12/2006 | Yamashita et al. | |
| 2007/0221871 A1 | 9/2007 | Callahan et al. | |
| 2009/0321657 A1 | 12/2009 | Satoh et al. | |
| 2010/0055345 A1 | 3/2010 | Biloiu et al. | |
| 2010/0143198 A1 | 6/2010 | Damiano, Jr. | |
| 2011/0248179 A1 | 10/2011 | Matesa, Jr. et al. | |
| 2011/0259269 A1 | 10/2011 | Biloiu et al. | |
| 2012/0025072 A1 | 2/2012 | Toyoda | |
| 2012/0286175 A1 | 11/2012 | Searle | |
| 2013/0094991 A1 | 4/2013 | Nagata | |
| 2017/0221677 A1 | 8/2017 | Asai et al. | |

FOREIGN PATENT DOCUMENTS

| | | |
|---|---|---|
| JP | 2007-048588 A | 2/2007 |
| JP | 2007-48588 A | 2/2007 |
| JP | 2012-033335 A | 2/2012 |
| JP | 2012-156077 A | 8/2012 |
| JP | 2013-524467 A | 6/2013 |

OTHER PUBLICATIONS

Office Action dated Jan. 30, 2018 for U.S. Appl. No. 15/500,392.
International Search Report, PCT/JP2015/071432, dated Oct. 13, 2015.
International Search Report, PCT/JP2015/071433, dated Oct. 20, 2015.
Office Action dated Oct. 6, 2017 for co-pending U.S. Appl. No. 15/500,392.
Office Action dated Jun. 19, 2018 for Japanese Application No. 2017-189451 and English language machine translation.
Non-Final Office Action dated Sep. 28, 2018 for U.S. Appl. No. 15/500,392.

* cited by examiner

[Fig. 1]
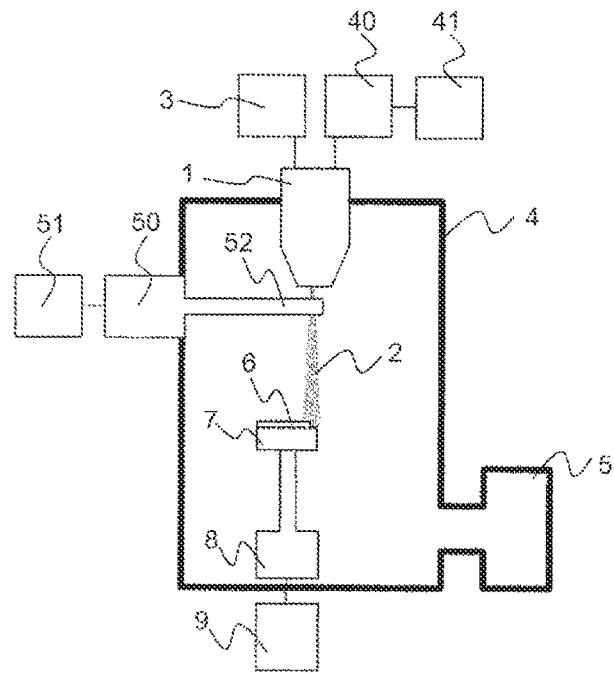
[Fig. 2]
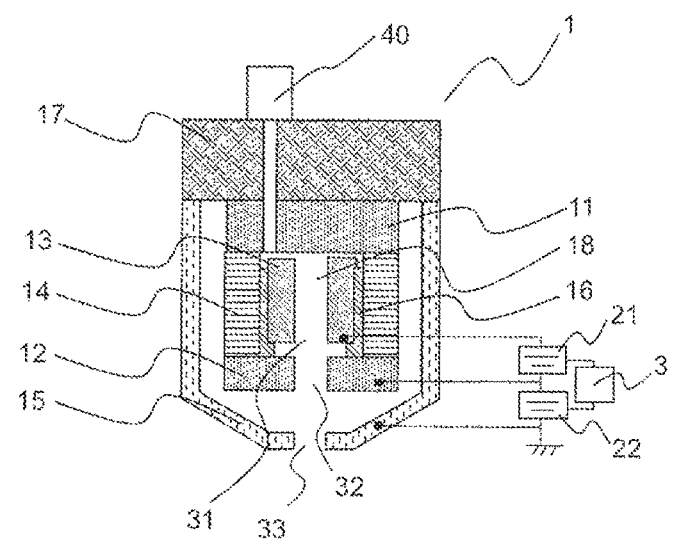

[Fig. 3]
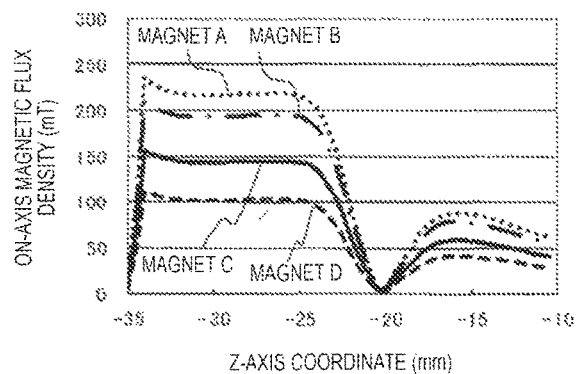
[Fig. 4]
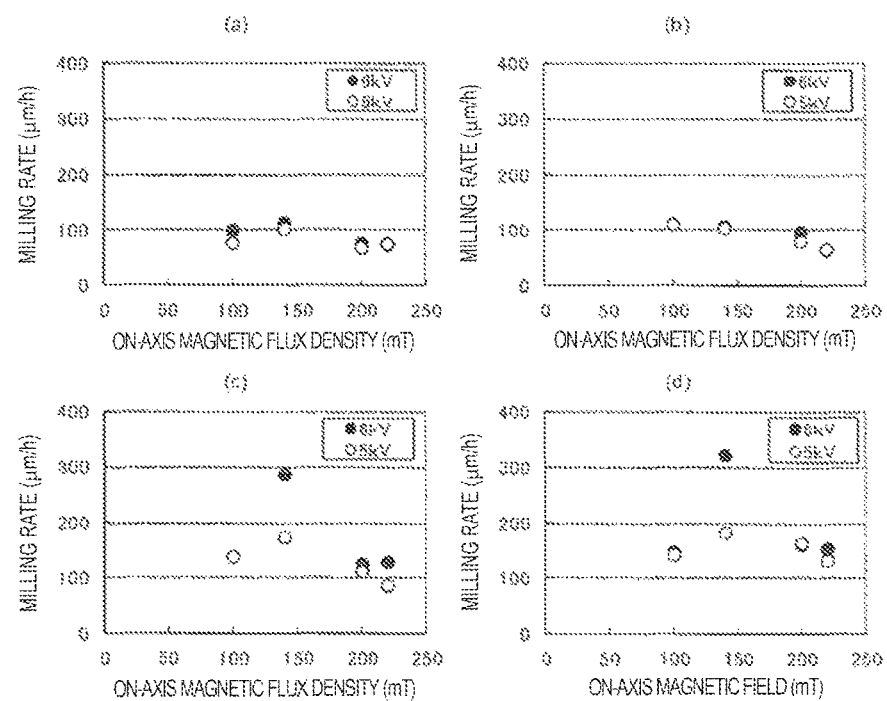

[Fig. 5]
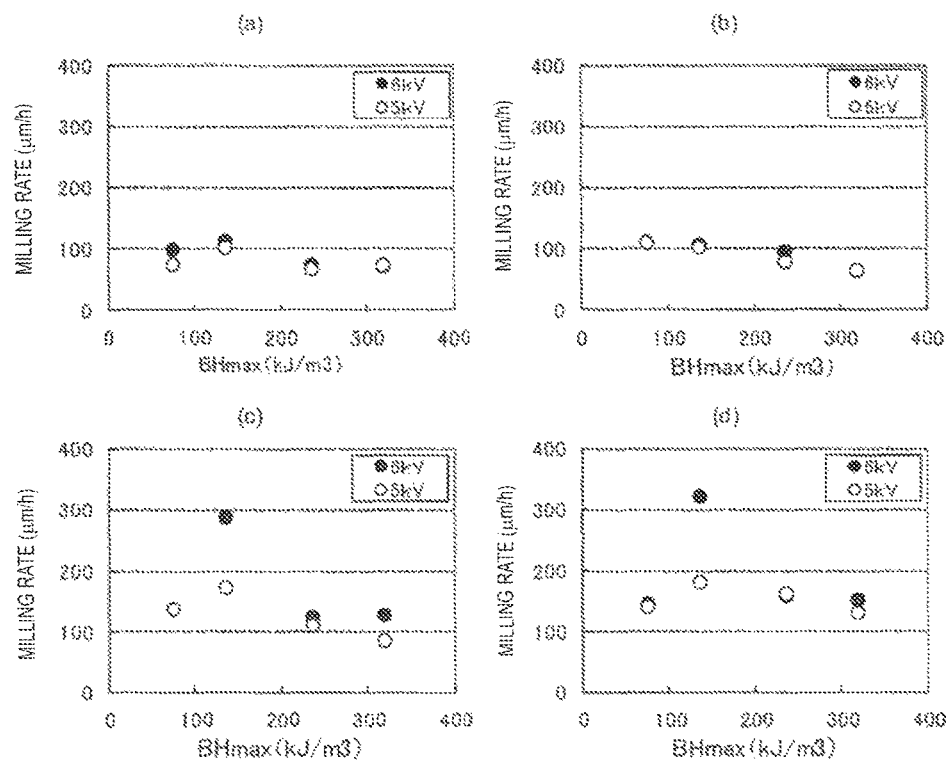

[Fig. 6]
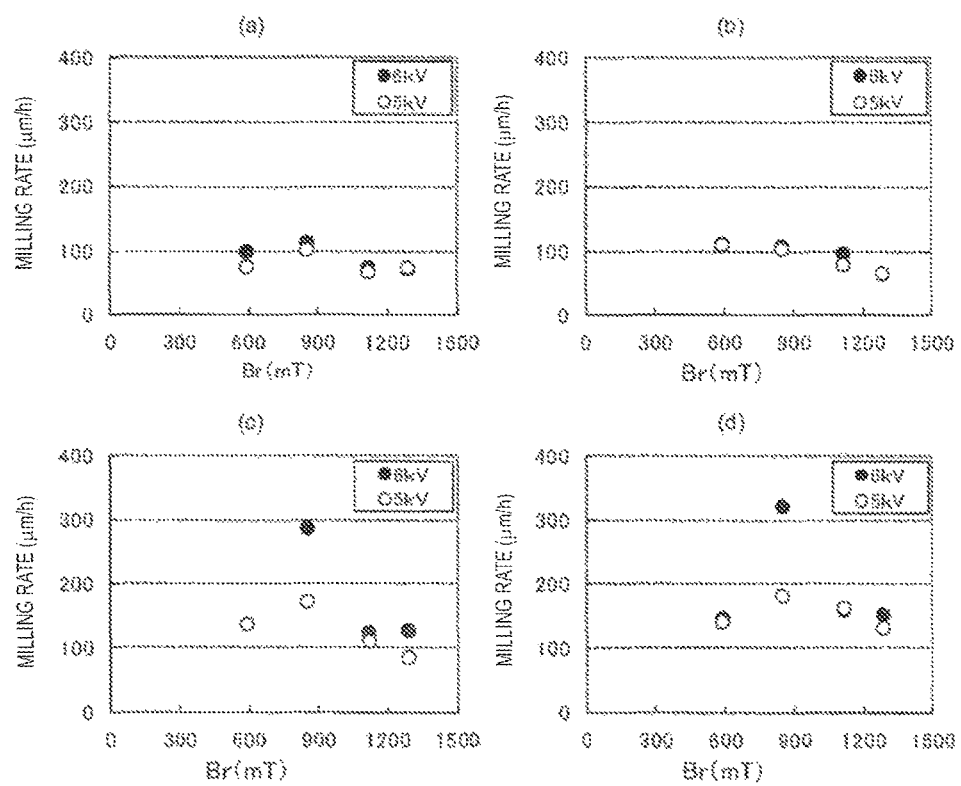

[Fig. 7]
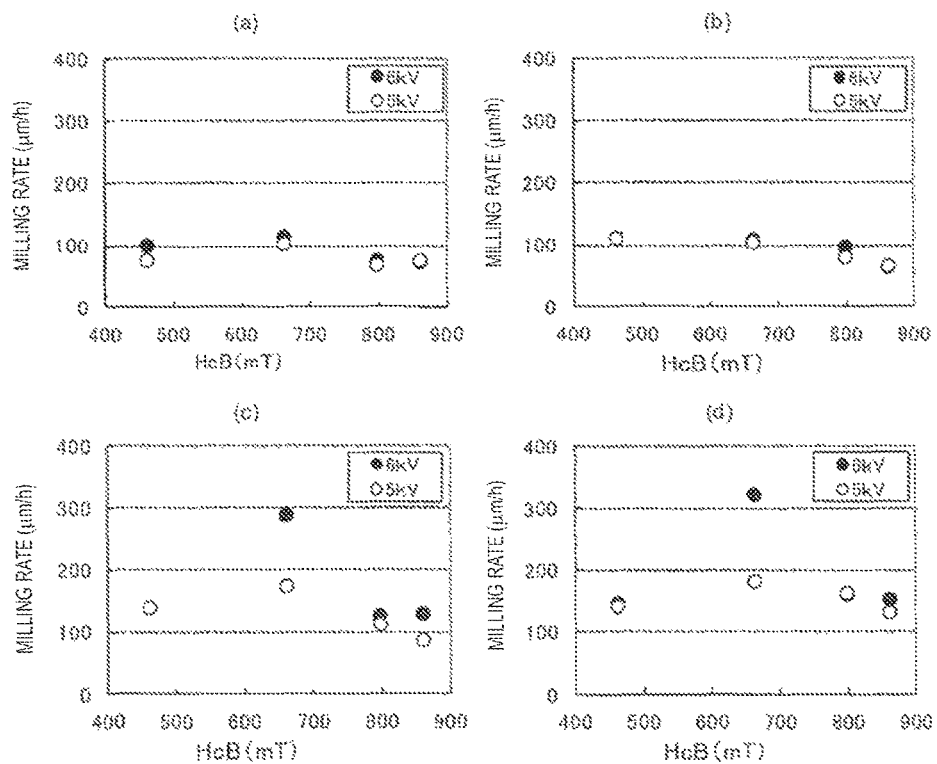

[Fig. 8]
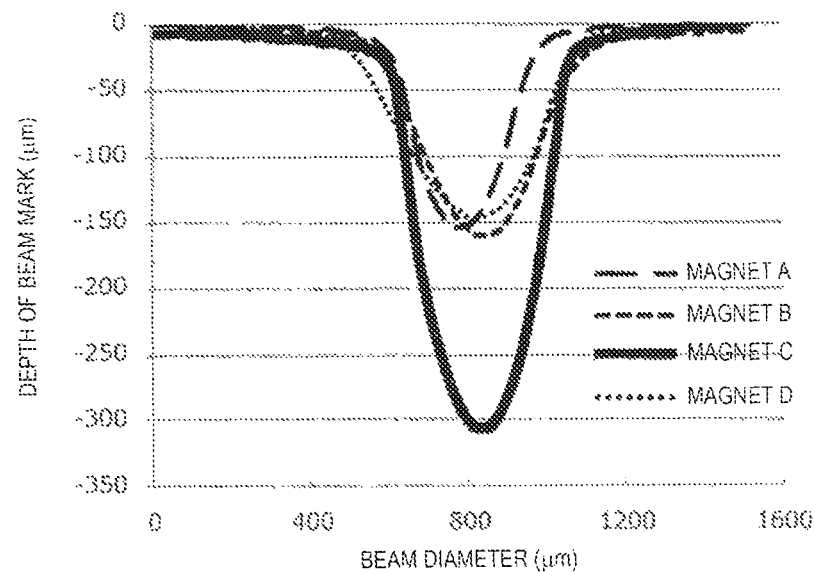
[Fig. 9]
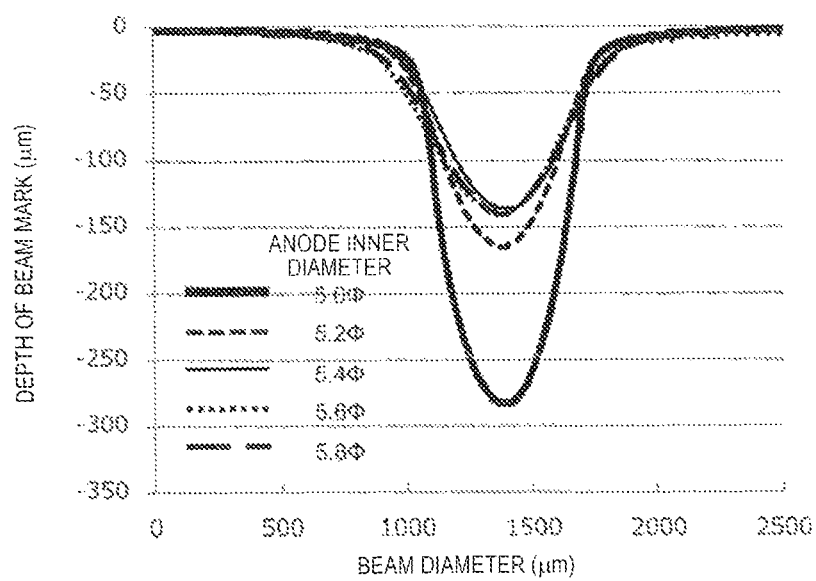

[Fig. 10]
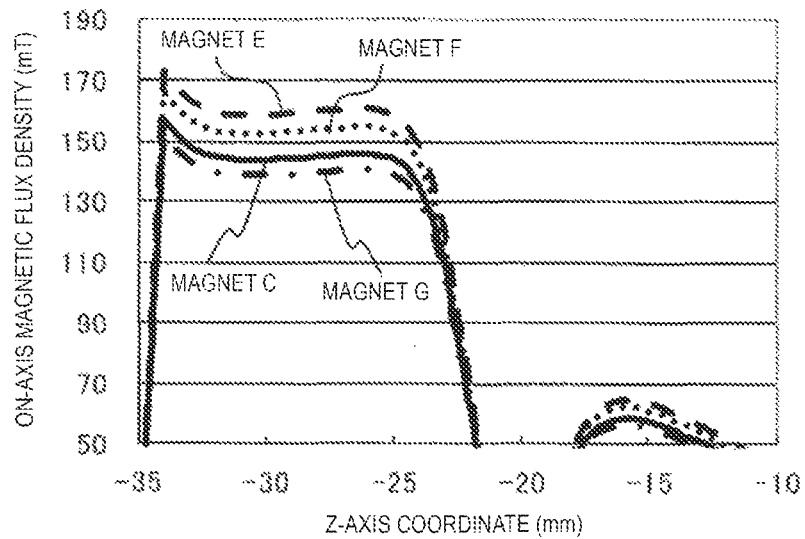
[Fig. 11]
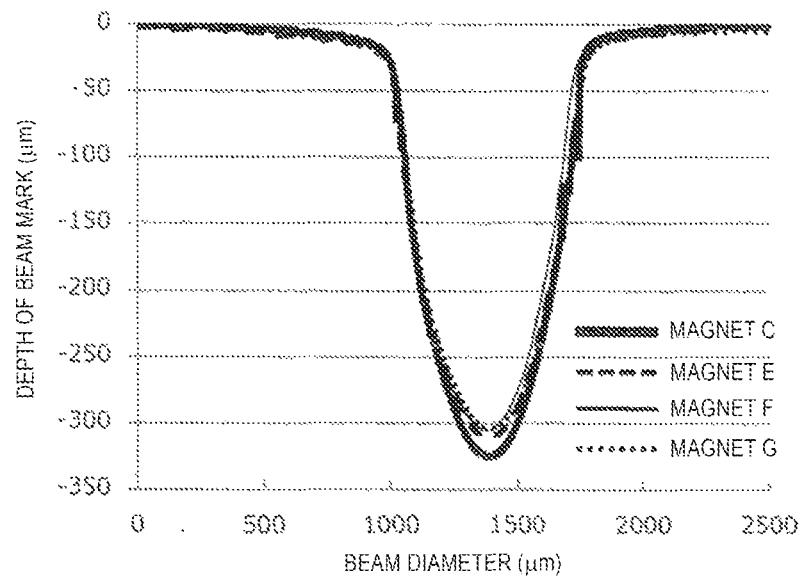

[Fig. 12]
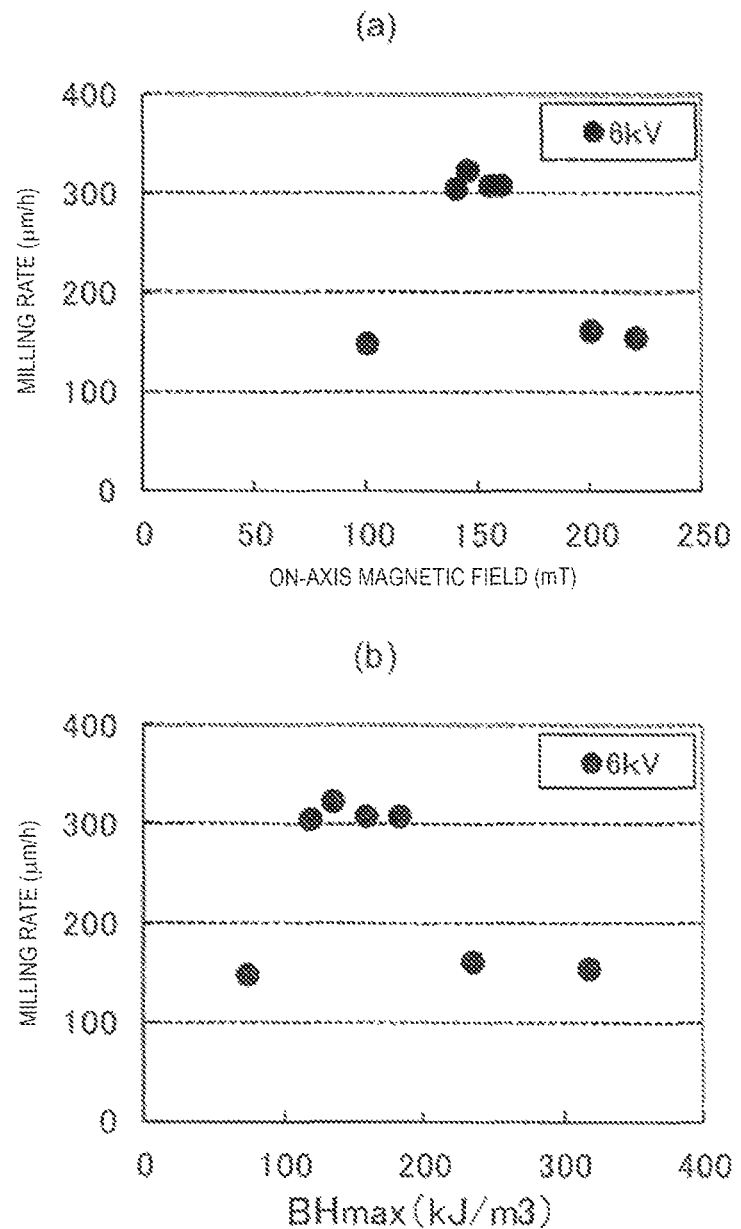

[Fig. 13]
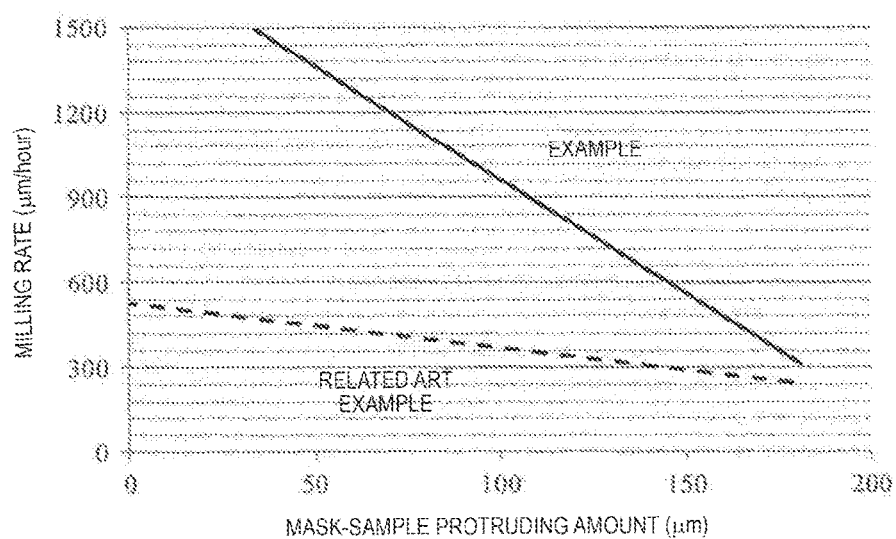

[Fig. 14]
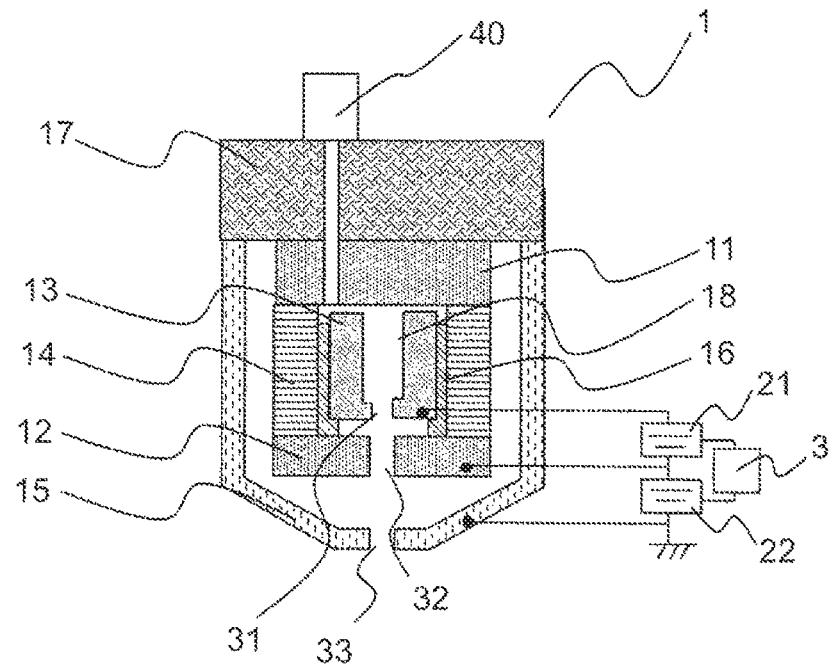
[Fig. 15]
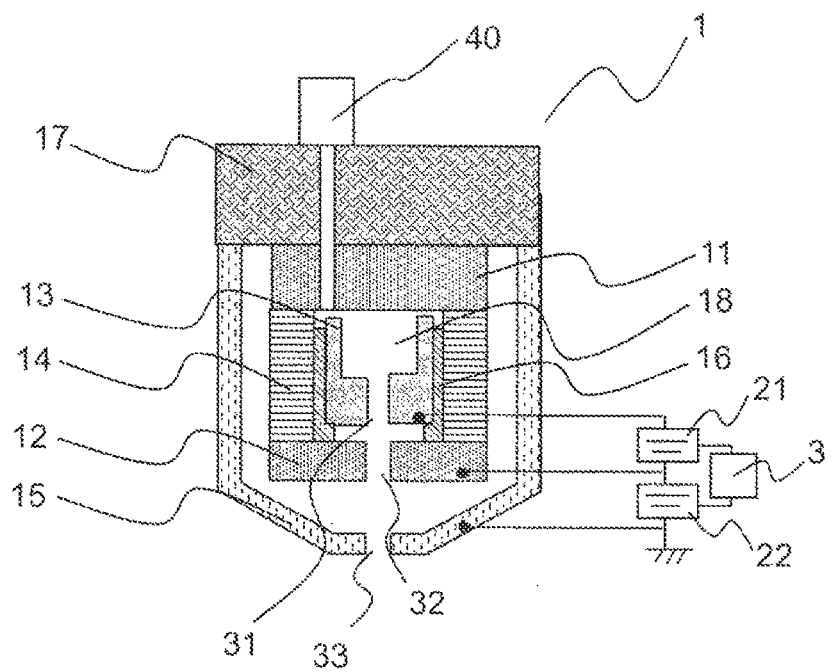

ION MILLING DEVICE, ION SOURCE AND ION MILLING METHOD

TECHNICAL FIELD

The present invention relates to an ion source for manufacturing a sample, an ion milling device including the same, and an ion milling method.

BACKGROUND ART

An ion milling method is a processing method of milling a sample by using a sputtering phenomenon in which accelerated ions collide with the sample and the ions repel atoms or molecules. A mask as a shielding plate of an ion beam on a top surface of the sample to be processed, and a smooth sectional surface can be processed by sputtering a protruding portion from a mask end surface. This method is used for targets such as metal, glass, ceramic, electronic components, and composite materials.

For example, this method is used for analyzing an internal structure, a sectional shape, film thickness evaluation, crystalline state, failure, or foreign-substance sectional surface of the electronic component. This method is used as a section sample creating method for performing acquisition of a morphological image, a sample compositional image, or a channeling image using various measurement devices including a scanning electron microscope, X-ray analysis, or crystallographic orientation analysis.

In the above-described ion milling device, an ion gun of a simple and small penning discharge type may be used as an ion gun. A basic structure of the ion gun of the penning discharge type includes a gas supply mechanism that supplies a gas into the ion gun, an anode which is provided within the ion gun and to which a positive voltage is applied, a cathode that generates a potential difference between the anode and the cathode, and a permanent magnet. The ion gun of the penning type has an advantage of achieving a high milling rate since energy of the ion beam is high. For example, PTL 1 describes a method of constantly maintaining a current value of the ion beam emitted from the ion gun at a maximum value in order to maintain a high milling rate.

CITATION LIST

Patent Literature

PTL 1: JP-A-2007-48588

SUMMARY OF INVENTION

Technical Problem

A market has greatly spread with advancing the recent ion milling device. Thus, there is a need for development of an ion gun that achieves a milling rate higher than that in the related art in some application fields. As one example, there is analysis of three-dimensional mounting using a through silicon via (TSV) watched with interest in the field of semiconductors. As stated above, there is a problem that much time is taken to process a thick layered sample with about 300 m per hour which is a criterion of the milling rate in the related art and an operation rate of the device is deteriorated.

Meanwhile, as described in PTL 1, the necessity of constantly maintaining the current value of the ion beam emitted from the ion gun at a large value in order to increase the milling rate has been considered in the method of the related art. Thus, it has been considered that a high plasma density is needed and it is important to elongate an orbit of electrons by forming a magnetic field having a high magnetic flux density.

However, the present inventors have repeatedly conducted an experiment in order to achieve the above-described object, and have acquired the following knowledge.

The present inventors have found that in order to increase the amount of ions emitted from the ion gun in the ion gun of the penning discharge type, it is important to control an area of an ionization chamber within a range in which a profile of the ion beam is ideally formed using a permanent magnet having a specific magnetic flux density and the ions are emitted from the ion gun without colliding with a peripheral portion of an acceleration-electrode outlet hole in the configuration of the ion gun.

It is considered that this is because the emitted ions collide with the peripheral portion of the acceleration-electrode outlet hole and the amount of ions emitted from the ion gun is reduced in the ion gun using an excessive magnetic field and an excessive ionization chamber area. Accordingly, as in PTL 1, the amount of ions emitted from the ion gun may be dramatically larger than that in the invention in which the current amount of the ion beam is constantly maintained at a large amount.

As described above, the invention using unique own knowledge of the present inventors has not been invented so far. Thus, the present invention suggests an ion gun of a penning discharge type capable of acquiring a milling rate which is remarkably higher than that in the related art based on such an experiment result and unique knowledge of the present inventors which is acquired from the experimental result, an ion milling device including the same, and an ion milling method. According to the present invention, it is possible to solve new problems which are widely on the rise with the market.

Solution to Problem

As a specific aspect, there is provided an ion milling device of the present invention that includes an ion generation unit which causes electrons to collide with a gas supplied from the outside and generates ions, and an acceleration electrode to which a voltage of 5 kV or more is applied as an electrode that accelerates the ions emitted from the ion generation unit, and irradiates a sample with the accelerated ions so as to process the sample. The ion generation unit includes a cathode from which the electrons are emitted, an anode that is provided within the ion generation unit and has an inner diameter of 5.2 mm or less, and a magnetic-field generation unit that generates a magnetic field within the ion generation unit by using a magnet having a maximum energy product ranging from 110 kJ/m$^3$ to 191 kJ/m$^3$.

As another specific aspect, there is provided an ion source of the present invention that is used in an ion milling device that includes an ion generation unit which causes electrons to collide with a gas supplied from the outside and generates ions, and an acceleration electrode to which a voltage of 5 kV or more is applied as an electrode that accelerates the ions emitted from the ion generation unit, and irradiates a sample with the accelerated ions so as to process the sample. The ion source includes: a cathode from which the electrons are emitted; an anode which is provided within the ion generation unit, and has an inner diameter of 5.2 mm or less; and a magnetic-field generation unit that generates a magnetic field within the ion generation unit by using a magnet having a maximum energy product ranging from 110 kJ/m$^3$ to 191 kJ/m$^3$.

As still another specific aspect, there is provided an ion milling device of the present invention that includes an ion generation unit which causes electrons to collide with a gas supplied from the outside and generates ions, and an acceleration electrode to which a voltage of 5 kV or more is applied as an electrode that accelerates the ions emitted from the ion generation unit, and irradiates a sample with the accelerated ions so as to process the sample. The ion generation unit includes a cathode from which the electrons are emitted, an anode that is provided within the ion generation unit and has an inner diameter of 5.2 mm or less, and a magnetic-field generation unit that generates a magnetic field on a central axis of the ion generation unit in a range of 140 mT to 160 mT.

As still another specific aspect, there is provided an ion milling method of the present invention that includes: an emission step of emitting electrons from a cathode; an ion generation step of causing the electrons to collide with a gas supplied from the outside on an inside of an anode having an inner diameter of 5.2 mm or less and generating ions; a magnetic-field generation step of causing the ions to act on a magnetic field generated by a magnet having a maximum energy product ranging from 110 kJ/m$^3$ to 191 kJ/m$^3$; an acceleration step of applying a voltage of 5 kV or more to the ions and accelerating the ions; and a processing step of irradiating a sample with the accelerated ions so as to process the sample.

Advantageous Effects of Invention

According to the present invention, it is possible to dramatically increase the amount of ions emitted from an ion gun by using a unique configuration acquired from knowledge of the inventors. Therefore, it is possible to achieve a milling rate which is remarkably higher than that in the related art.

BRIEF DESCRIPTION OF DRAWINGS

FIG. 1 is an explanatory diagram showing a configuration of an ion milling device of the present invention.

FIG. 2 is an example of a sectional view showing a configuration of a peripheral portion associated with an ion gun of the present invention.

FIG. 3 is an example of a diagram showing comparison between on-axis magnetic-field strengths within the ion gun of the present invention.

FIG. 4 is a diagram showing the relationship between a milling rate and an on-axis magnetic flux density of the ion gun in order to describe the advantages of the present invention. (a) shows when an anode inner diameter is 8 mm, (b) shows when the anode inner diameter is 6 mm, (c) shows when the anode inner diameter is 5 mm, and (d) shows when the anode inner diameter is 4 mm.

FIG. 5 is a diagram showing the relationship between a milling rate and a maximum energy product of a permanent magnet in order to describe the advantages of the present invention. (a) shows when an anode inner diameter is 8 mm, (b) shows when the anode inner diameter is 6 mm, (c) shows when the anode inner diameter is 5 mm, and (d) shows when the anode inner diameter is 4 mm.

FIG. 6 is a diagram showing the relationship between the milling rate and the residual magnetic flux density of the permanent magnet in order to describe the advantages of the present invention. (a) shows when an anode inner diameter is 8 mm, (b) shows when the anode inner diameter is 6 mm, (c) shows when the anode inner diameter is 5 mm, and (d) shows when the anode inner diameter is 4 mm.

FIG. 7 is a diagram showing the relationship between the milling rate and the holding force of the permanent magnet in order to describe the advantages of the present invention. (a) shows when an anode inner diameter is 8 mm, (b) shows when the anode inner diameter is 6 mm, (c) shows when the anode inner diameter is 5 mm, and (d) shows when the anode inner diameter is 4 mm.

FIG. 8 is an example of a diagram showing a beam profile of the present invention.

FIG. 9 is another example of a diagram showing the beam profile of the present invention.

FIG. 10 is another example of a diagram showing comparison between on-axis magnetic-field strengths within the ion gun of the present invention.

FIG. 11 is still another example of a diagram showing the beam profile of the present invention.

FIG. 12 is an example of a diagram showing the relationship between the milling rate and the magnetic field strength in order to describe the advantage of the present invention.

FIG. 13 is an example of a diagram showing the relationship between the milling rate and the protruding amount of the sample from a mask of the present invention.

FIG. 14 is another example of a sectional view showing the configuration of the peripheral portion associated with the ion gun of the present invention.

FIG. 15 is still another example of a sectional view showing the configuration of the peripheral portion associated with the ion gun of the present invention.

DESCRIPTION OF EMBODIMENTS

The present invention relates to an ion milling device including an ion gun for manufacturing a sample observed in an electron microscope, and relates to an ion gun of a penning discharge type capable of achieving a milling rate which is remarkably higher than that in the related art or has a shape conformable to the penning discharge type, an ion milling device including the same, and an ion milling method.

To achieve this, in a such a configuration of the ion gun of the penning discharge type, a specific ionization chamber area is controlled to generate ions such that it is possible to remarkably increase the amount of ions emitted from the ion gun by using the permanent magnet having specific magnetic field strength based on the knowledge of the present inventors. Accordingly, it is possible to achieve a milling rate which is remarkably higher than that in the related art.

The respective configurations of the ion gun of the present invention have more advantages in addition to the stabilization of the ion beam current than those in the related art. This is because it is possible to prevent ions emitted by an excessive magnetic field or an excessive ionization chamber area from colliding with the peripheral portion of the acceleration-electrode outlet hole. For example, there is an advantage that bad influence such as reposition adhering to the acceleration electrode, deformation of the acceleration-electrode outlet hole, or contamination due to the redeposition is reduced.

Hereinafter, a preferred embodiment of the present invention will be described with reference to the drawings.

FIG. 1 is an explanatory diagram showing a configuration of an ion milling device of the present invention. In an ion gun 1 of a so-called penning discharge type or an ion gun 1 having a form conformable to this type, constituent elements required to generate ions are provided therein, and an irradiation system for irradiating a sample 6 with an ion beam 2 is constituted.

Next, a gas source 41 is connected to the ion gun 1 through a gas supply mechanism 40, and a gas of which a flow rate is controlled by the gas supply mechanism 40 is supplied into an ionization chamber of the ion gun 1. The irradiation using the ion beam 2 and an ion beam current thereof are controlled by an ion-gun control unit 3. The ion beam current of the ion beam 2 is measured by a current measurement unit 50. A current probe 52 serves as a shutter of the ion beam, and includes a mechanism operated by a current-probe driving unit 51.

A vacuum chamber 4 is controlled to be in an atmospheric state or a vacuum state by a vacuum pumping system 5. The sample 6 is held on a sample support 7, and the sample support 7 is held by a sample stage 8. The sample stage 8 includes all mechanism elements which are capable of taking the sample stage out of the vacuum chamber 4 when the vacuum chamber 4 is open to atmosphere and are capable of tilting the sample 6 with respect to an optical axis of the ion beam 2 at an arbitrary angle. A sample-stage driving unit 9 may swing the sample stage 8 from side to side, and may control a rate thereof.

FIG. 2 is an example of a sectional view showing a configuration of a peripheral portion associated with the ion gun of the present invention. For example, a cathode 11 is made of a conductive magnetic material such as pure iron, and has a disk shape. A hole for introducing an inert gas to an ionization chamber 18 is formed in the cathode. Here, although it has been described that an argon gas is used as a representative example of the inert gas, the present invention may be applied to other inert gases.

Next, a permanent magnet 14 serves as a magnetic-field generation unit. For example, the permanent magnet is a samarium-cobalt magnet having a maximum energy product that ranges from 127 kJ/m$^3$ to 143 kJ/m$^3$, and has a cylindrical shape or a shape conformable to the cylindrical shape. An end of the permanent magnet 14 is coupled to the cathode 11 made of the magnetic material. Here, although it has been described that the permanent magnet is used, a magnetic-field generation unit (for example, a coil) having a specific range of performance defined in the present invention may be used.

For example, a cathode 12 is made of a conductive magnetic material such as pure iron, and has a disk shape. For example, a cathode outlet hole 32 having a diameter of 4 mm is formed in a central portion of the cathode. The cathode 12 is coupled to the other end of the permanent magnet 14, and generates a magnetic field within the ion gun 1 due to the configurations of the cathode 11 and the permanent magnet 14. An insulator 16 having a cylindrical shape is disposed inside the permanent magnet 14, and an outer surface of the insulator 16 is in contact with an inner surface of the permanent magnet 14. For example, the insulator 16 is made of a non-magnetic material, such as ceramics, having electrical insulation properties.

An anode 13 is fit into the insulator 16 such that an outer surface of the anode 13 is in contact with an inner surface of the insulator 16 and an inner surface thereof faces the ionization chamber 18. For example, the anode 13 is made of a conductive non-magnetic material such as aluminium, and has an inner diameter of 4 mm. A diameter of an anode outlet hole 31 is also 4 mm which is equal to the anode inner diameter. The anode 13 is electrically insulated from the cathode 11, the cathode 12, and the permanent magnet 14 by using the insulator 16.

For example, an acceleration electrode 15 is made of a conductive non-magnetic material such as stainless steel, and has a cylindrical shape. For example, an acceleration-electrode outlet hole 33 having a diameter of 4 mm is formed in a central portion through which the ion beam passes. The acceleration electrode 15 held by a ground electrode is fixed to a peripheral portion of an ion gun base 17 so as to surround the cathode 11, the cathode 12, and the permanent magnet 14.

The gas supply mechanism 40 includes all constituent elements that are connected to the ion gun base 17, adjust a flow rate of a gas to be ionized, and supply the gas into the ion gun. Holes are formed in the ion gun base 17 and the cathode 11, and the argon gas introduced from the gas introduction mechanism 40 is introduced to the ionization chamber 18 through these holes.

The argon gas introduced to the ionization chamber 18 is in an appropriate gas pressure state. A discharge (glow discharge) is performed by applying a discharge voltage of about 0 to 4 kV between the cathode 11, the cathode 12, and the anode 13 by using a discharge power source 21, and thus, argon ions are generated. In this case, electrons generated through discharge are rotated by the magnetic field of the permanent magnet 14, and a path of the electrons is elongated. Thus, it is possible to improve discharge efficiency. An acceleration voltage of about 0 to 10 kV (or more) is applied between the cathode 12 and the acceleration electrode 15 by using an acceleration power source 22, and the argon ions are accelerated. Thus, the ion beam 2 is emitted to the outside of the ion gun 1. The permanent magnet 14 and the cathode 11 which are electrically connected to the cathode 12 are maintained at the same potential as that of the cathode 12.

Electrons are emitted from a surface of the cathode 11 and a surface of the cathode 12 by such voltage application, and the emitted electrons are accelerated toward the anode 13. In this case, since an orbit thereof is bent by a magnetic field formed in the ionization chamber 18 by the cathode 11, the cathode 12, and the permanent magnet 14, the electrons emitted from the surfaces of the cathode 11 and the cathode 12 turn.

Here, if the electrons turning within the ionization chamber 18 collide with the argon gas, the collided argon gas is ionized, and positive ions are generated in the ionization chamber 18. Some of the positive ions generated in the ionization chamber 18 pass through the cathode outlet hole 32 of the cathode 12, are accelerated in the acceleration electrode 15, and are emitted to the outside of the ion gun 1 through the acceleration-electrode outlet hole 33. Thus, the sample 6 is processed by the ion beam 2 including the positive ions.

The present inventors have conducted the experiment repeatedly to produce, as an object thereof, the ion gun of the penning discharge type capable of achieving the milling rate which is remarkably higher than that in the related art and have uniquely found that a high milling rate that is not able to be predicted in the related art is acquired when the magnetic field strength of the permanent magnet 14 and the inner diameter of the anode 13 for setting the area of the ionization chamber fall within the specific range in such an ion gun configuration. Therefore, according to the present invention, it is possible to provide the ion gun of the penning discharge type capable of achieving the milling rate which is remarkably higher than that in the related art, the ion milling device including the same, and the ion milling method.

TABLE 1

|  | Magnet A | Magnet B | Magnet C | Magnet D |
|---|---|---|---|---|
| Maximum energy product: (BH)max (kJ/m3) | 302~334 | 223~247 | 127~143 | 68~80 |
| Residual magnetic flux density: Br(mT) | 1250~1320 | 1080-1150 | ≥850 | ≥590 |
| Holding force: HcB(kA/m) | ≥859 | ≥796 | ≥660 | ≥460 |
| On-axis magentic flux density (mT) | 220 | 200 | 145 | 100 |

A performance list of magnets used in the experiment is represented in Table 1. FIG. 3 is an example of a diagram showing comparison between on-axis magnetic-field strengths within the ion gun of the present invention. FIG. 3 shows a result acquired by calculating magnetic flux densities on a central axis of the ion gun by using a magnetic field simulator in a case where four types of magnets including Magnet A to Magnet D represented in Table 1 are used as the permanent magnet 14 of the ion gun 1. The values represented in Table 1 are used as the residual magnetic flux densities (i.e., remanence), and holding forces used in the calculation.

A range of a position in which the magnet is disposed in a Z-axis coordinate as a horizontal axis of FIG. 3 is Z=−34.5 to −22.5. This area serves as a plasma generation chamber within the ion gun, an on-axis magnetic flux density is about 220 mT in Magnet A, is about 200 mT in Magnet B, is about 145 mT in Magnet C, and is about 100 mT in Magnet D.

FIG. 4 is a diagram showing the relationship between a milling rate and the on-axis magnetic flux density of the ion gun in order to describe the advantages of the present invention. (a) shows a result in a case where the anode inner diameter is 8 mm, (b) shows a result in a case where the anode inner diameter is 6 mm, (c) shows a result in a case where the anode inner diameter is 5 mm, and (d) shows a result in a case where the anode inner diameter is 4 mm. As a milling condition applied to the experiment, two types of acceleration voltages 5 kV and 6 kV are used, a discharge voltage of 1.5 kV is used, an argon gas is used as a gas introduced to the ion gun, and a flow rate thereof is 0.07 cm$^3$/minute. This diagram shows results in a case where silicon is used as a processing target material and milling is performed without using a mask as a shielding plate for one hour. It can be seen from the results of FIG. 4 that a milling rate which is equal to or greater than twice the milling rate in other conditions is acquired only in a case where the acceleration voltage is 6 kV, the on-axis magnetic flux density of the ion gun is around 140 mT, and the anode inner diameter is equal to or less than 5 mm.

FIG. 5 is a diagram showing the relationship between a milling rate and a maximum energy product of the permanent magnet in order to describe the advantages of the present invention. (a) shows a result in a case where the anode inner diameter is 8 mm, (b) shows a result in a case where the anode inner diameter is 6 mm, (c) shows a result in a case where the anode inner diameter is 5 mm, and (d) shows a result in a case where the anode inner diameter is 4 mm. It can be seen from the results of FIG. 5 that a milling rate which is equal to or greater than twice the milling rate in other conditions is acquired only in a case where the acceleration voltage is 6 kV, the maximum energy product of the permanent magnet ranges from 127 kJ/m$^3$ to 143 kJ/m$^3$, and the anode inner diameter is equal to or less than 5 mm.

FIG. 6 is a diagram showing the relationship between the milling rate and the residual magnetic flux density (i.e., remanence) of the permanent magnet in order to describe the advantages of the present invention. (a) shows a result in a case where the anode inner diameter is 8 mm, (b) shows a result in a case where the anode inner diameter is 6 mm, (c) shows a result in a case where the anode inner diameter is 5 mm, and (d) shows a result in a case where the anode inner diameter is 4 mm. It can be seen from the results of FIG. 6 that a milling rate which is equal to or greater than twice the milling rate in other conditions is acquired only in a case where the acceleration voltage is 6 kV, the residual magnetic flux density (remanence) of the permanent magnet is 850 mT, and the anode inner diameter is equal to or less than 5 mm.

FIG. 7 is a diagram showing the relationship between the milling rate and the holding force of the permanent magnet in order to describe the advantages of the present invention. (a) shows a result in a case where the anode inner diameter is 8 mm, (b) shows a result in a case where the anode inner diameter is 6 mm, (c) shows a result in a case where the anode inner diameter is 5 mm, and (d) shows a result in a case where the anode inner diameter is 4 mm. It can be seen from the results of FIG. 7 that a milling rate which is equal to or greater than twice the milling rate in other conditions is acquired only in a case where the acceleration voltage is 6 kV, the holding force of the permanent magnet is 660 mT, and the anode inner diameter is equal to or less than 5 mm.

FIG. 8 is an example of a diagram showing a beam profile of the present invention. Here, in an ion gun configuration in which four types of magnets including Magnet A to Magnet D represented in Table 1 are used as the permanent magnet 14 of the ion gun 1 and the anode inner diameter is 4 mm, the acceleration voltage is 6 kV, the discharge voltage is 1.5 kV, and the argon gas of which the flow rate is 0.07 cm$^3$/minute is used as the gas introduced to the ion gun. This diagram shows a beam profile in a case where the silicon is used as the processing target material and the milling is performed without using the mask as the shielding plate for one hour. It can be seen from the result of FIG. 8 that a depth of a beam mark is 300 μm only in the case of Magnet C, that is, the milling rate is 300 μm every hour, and a milling rate which is about twice the milling rate in other conditions can be acquired. In this case, a spot diameter of the ion beam is also not reduced.

FIG. 9 is another example of the diagram showing the beam profile of the present invention. Here, in an ion gun configuration in which Magnet C represented in Table 1 is used as the permanent magnet 14 of the ion gun 1, five types of anode inner diameters of 5.0 mm, 5.2 mm, 5.4 mm, 5.6 mm, and 5.8 mm are used, the acceleration voltage is 6 kV, the discharge voltage is 1.5 kV, and the argon gas of which the flow rate is 0.07 cm$^3$/minute is used as the gas introduced to the ion gun. This diagram shows a beam profile in a case where the silicon is used as the processing target material and the milling is performed without using the mask as the shielding plate for one hour. It can be seen from the result of FIG. 9 that the depth of the beam mark is 290 μm in a case where the anode inner diameter is 5.0 mm, and a milling rate which is about twice the milling rate in a case where the anode inner diameter is equal to or greater than 5.4 mm can be acquired. Since it can be seen that the milling rate is slightly improved even in a case where the anode inner diameter is 5.2 mm, if the anode inner diameter is equal to or less than 5.2 mm, it is assumed that such an anode inner diameter is included in the scope of the ideas of the present invention. Particularly, in an area of such an anode inner diameter in which a remarkable advantage is exhibited, the anode inner diameter is equal to or less than 5.0 mm.

TABLE 2

| | Magnet E | Magnet F | Magnet C | Magnet G |
|---|---|---|---|---|
| Maximum energy product: (BH)max (kJ/m3) | 175~191 | 150~167 | 127~143 | 110~127 |
| Residual magnetic flux density: Br(mT) | ≥950 | ≥900 | ≥850 | ≥810 |
| Holding force: HcB(kA/m) | ≥637 | ≥653 | ≥660 | ≥620 |
| On-axis magentic flux density (mT) | 160 | 155 | 147 | 140 |

A performance list of other magnets used in the experiment is represented in Table 2. FIG. 10 is another example of a diagram showing comparison between on-axis magnetic-field strengths within the ion gun of the present invention. FIG. 10 shows a result acquired by calculating magnetic flux densities on a central axis of the ion gun by using a magnetic field simulator in a case where four types of magnets including Magnet C to Magnet G represented in Table 2 are used as the permanent magnet 14 of the ion gun 1. The values represented in Table 2 are used as the residual magnetic flux densities (i.e, remanence) and holding forces used in the calculation.

A range of a position in which the magnet is disposed in a Z-axis coordinate as a horizontal axis of FIG. 10 is Z=−34.5 to −22.5. This area serves as a plasma generation chamber within the ion gun, the on-axis magnetic flux density is about 160 mT in Magnet E, is about 155 mT in Magnet F, is about 145 mT in Magnet C, and is about 140 mT in Magnet G.

FIG. 11 is still another example of the diagram showing the beam profile of the present invention. Here, in an ion gun configuration in which four types of magnets including Magnet C to Magnet G represented in Table 2 are used as the permanent magnet 14 of the ion gun 1 and the anode inner diameter is 4 mm, the acceleration voltage is 6 kV, the discharge voltage is 1.5 kV, and the argon gas of which the flow rate is 0.07 cm$^3$/minute is used as the gas introduced to the ion gun. This diagram shows a beam profile in a case where the silicon is used as the processing target material and the milling is performed without using the mask as the shielding plate for one hour. It can be seen from the result of FIG. 11 that the depth of the beam mark is 300 μm in all four types of magnets including Magnet C to Magnet G, that is, a milling rate of 300 μm can be acquired for every hour.

FIG. 12 is an example of a diagram showing the relationship between the milling rate and the magnetic field strength in order to describe the advantage of the present invention. (a) shows the relationship between the milling rate and the on-axis magnetic flux density of the ion gun, and (b) shows the relationship between the milling rate and the maximum energy product of the permanent magnet. Here, in an ion gun configuration in which seven types of magnets including Magnet A to Magnet G represented in Table 1 and Table 2 are used as the permanent magnet 14 of the ion gun 1 and the anode inner diameter is 4 mm, an acceleration voltage of 6 kV is used, a discharge voltage of 1.5 kV is used, an argon gas is used as a gas introduced to the ion gun, and a flow rate thereof is 0.07 cm$^3$/minute. This diagram shows results in a case where silicon is used as a processing target material and milling is performed without using a mask as a shielding plate for one hour. It can be seen from the results of FIG. 12 that a milling rate which is equal to or greater than twice the milling rate in other magnets is acquired in the cases of Magnet C, Magnet E, Magnet F, and Magnet G. The magnetic field strengths of these magnets are shown that the maximum energy product ranges from 110 kJ/m$^3$ to 191 kJ/m$^3$, the residual magnetic flux density (remanence) ranges from 810 mT to 950 mT, and the holding force ranges from 620 mT to 660 mT.

As described above, according to the present invention, in such a configuration of the ion gun 1, it is possible to remarkably increase the amount of ions emitted from the ion gun, and it is possible to achieve the milling rate which is equal to or greater than twice the milling rate of the related art by (1) controlling the on-axis magnetic flux density of the ion gun 1 within a range of 140 to 160 mT through the application of the magnet of which the maximum energy product ranges from 110 kJ/m$^3$ to 191 kJ/m$^3$ which is appropriate magnetic field strength as the permanent magnet 14, (2) restricting the anode inner diameter to be 5 mm or less as an appropriate ionization chamber area, and (3) restricting the acceleration voltage to be 6 kV or more.

It can be seen from the results of FIGS. 4 to 7 that since the milling rate is slightly improved even in a case where the acceleration voltage is 5 kV, if the acceleration voltage is equal to or greater than 5 kV, it is possible to realize a favorable condition in the present invention. Accordingly, if the acceleration voltage is equal to or greater than 5 kV, it is assumed that such an acceleration voltage is included in the scope of the ideas of the present invention. Particularly, in an area of such an acceleration voltage in which a remarkable advantage is exhibited, the acceleration voltage is equal to or greater than 6 kV.

It can be seen from the result of FIG. 9 that since the milling rate is slightly improved even in a case where the anode inner diameter is 5.2 mm, if the anode inner diameter is equal to or less than 5.2 mm, it is assumed that such an anode inner diameter is included in the scope of the ideas of the present invention. Particularly, in an area of such an anode inner diameter in which a remarkable advantage is exhibited, the anode inner diameter is equal to or less than 5.0 mm.

FIG. 13 is an example of a diagram showing the relationship between the milling rate and the protruding amount of the sample from the mask of the present invention. Here, the mask as the shielding plate of the ion beam is mounted on a top surface of the sample to be processed, section processing for performing the milling on the protruding portion from the mask end surface is performed, and a horizontal axis of FIG. 13 represents the protruding amount of the sample from the mask. Here, in an example, the ion gun configuration in which Magnet C of Table 1 is used as the permanent magnet 14 of the ion gun 1, the anode inner diameter is 4 mm, and the diameter of the anode outlet hole 31 is 4 mm which is the same dimension as the anode inner diameter is evaluated. Meanwhile, in a related art example, Magnet A of Table 1 is used as the permanent magnet 14 of the ion gun 1, and the ion gun configuration in which the anode inner diameter is 8 mm and the diameter of the anode outlet hole 31 is 4 mm is evaluated. The acceleration voltage is 6 kV, the discharge voltage is 1.5 kV, and the argon gas of which the flow rate is 0.07 cm3/minute is used as the gas introduced to the ion gun. The silicon is used as the processing target material, and a milling time is set to be one hour. From the result of FIG. 13, in a processing condition in which the protruding amount of the sample from the mask is 50 μm, in the example, a milling rate of 1350 μm per minute can be achieved and the milling rate is remarkably improved about three times greater than the milling rate which is 450 μm per minute in the related art.

As described above, according to the present invention, it is possible to provide the ion gun of the penning discharge type capable of ideally increasing the amount of ions emitted from the ion gun and achieving the milling rate which is remarkably higher than that in the related art, the ion milling device including the same, and the ion milling method.

FIG. 14 is another example of a sectional view showing a configuration of a peripheral portion associated with the ion gun of the present invention. For example, the cathode 11 is made of a conductive magnetic material such as pure iron, and has a disk shape. A hole for introducing the argon gas to the ionization chamber 18 is formed. For example, the permanent magnet 14 is a samarium-cobalt magnet having residual magnetic flux density (remanence) that ranges from 810 mT to 950 mT, and has a cylindrical shape. An end of the permanent magnet 14 is coupled to the cathode 11 made of the magnetic material. For example, the cathode 12 is made of a conductive magnetic material such as pure iron, and has a disk shape. For example, a cathode outlet hole 32 having a diameter of 4 mm is formed in the central portion of the cathode. The cathode 12 is coupled to the other end of the permanent magnet 14, and generates a magnetic field within the ion gun 1 due to the configurations of the cathode 11 and the permanent magnet 14. An insulator 16 having a cylindrical shape is disposed inside the permanent magnet 14, and an outer surface of the insulator 16 is in contact with an inner surface of the permanent magnet 14. For example, the insulator 16 is made of a non-magnetic material, such as ceramics, having electrical insulation properties. An anode 13 is fit into the insulator 16 such that an outer surface of the anode 13 is in contact with an inner surface of the insulator 16 and an inner surface thereof faces the ionization chamber 18. For example, the anode 13 is made of a conductive non-magnetic material such as aluminium, and has an inner diameter of 5 mm. A diameter of the anode outlet hole 31 is 4 mm. The anode 13 is electrically insulated from the cathode 11, the cathode 12, and the permanent magnet 14 by using the insulator 16. For example, an acceleration electrode 15 is made of a conductive non-magnetic material such as stainless steel, and has a cylindrical shape. For example, the acceleration-electrode outlet hole 33 having a diameter of 2 mm is formed in the central portion. The acceleration electrode 15 held by a ground electrode is fixed to a peripheral portion of an ion gun base 17 so as to surround the cathode 11, the cathode 12, and the permanent magnet 14. The gas supply mechanism 40 includes all constituent elements that are connected to the ion gun base 17, adjust a flow rate of a gas to be ionized, and supply the gas into the ion gun. Holes are formed in the ion gun base 17 and the cathode 11, and the argon gas introduced from the gas introduction mechanism 40 is introduced to the ionization chamber 18.

FIG. 15 is still another example of a sectional view showing a configuration of a peripheral portion associated with the ion gun of the present invention. For example, the cathode 11 is made of a conductive magnetic material such as pure iron, and has a disk shape. A hole for introducing the argon gas to the ionization chamber 18 is formed. For example, the permanent magnet 14 is a samarium-cobalt magnet having a holding force that ranges from 620 mT to 660 mT, and has a cylindrical shape. An end of the permanent magnet 14 is coupled to the cathode 11 made of the magnetic material. For example, the cathode 12 is made of a conductive magnetic material such as pure iron, and has a disk shape. For example, a cathode outlet hole 32 having a diameter of 3 mm is formed in a central portion of the cathode. The cathode 12 is coupled to the other end of the permanent magnet 14, and generates a magnetic field within the ion gun 1 due to the configurations of the cathode 11 and the permanent magnet 14.

An insulator 16 having a cylindrical shape is disposed inside the permanent magnet 14, and an outer surface of the insulator 16 is in contact with an inner surface of the permanent magnet 14. For example, the insulator 16 is made of a non-magnetic material, such as ceramics, having electrical insulation properties. An anode 13 is fit into the insulator 16 such that an outer surface of the anode 13 is in contact with an inner surface of the insulator 16 and an inner surface thereof faces the ionization chamber 18. For example, the anode 13 is made of a conductive non-magnetic material such as aluminium, and has an inner diameter of 4 mm. A diameter of the anode outlet hole 31 is 3 mm. The anode 13 is electrically insulated from the cathode 11, the cathode 12, and the permanent magnet 14 by using the insulator 16. For example, an acceleration electrode 15 is made of a conductive non-magnetic material such as stainless steel, and has a cylindrical shape. For example, the acceleration-electrode outlet hole 33 having a diameter of 2 mm is formed in the central portion.

The acceleration electrode 15 held by a ground electrode is fixed to a peripheral portion of an ion gun base 17 so as to surround the cathode 11, the cathode 12, and the permanent magnet 14. The gas supply mechanism 40 includes all constituent elements that are connected to the ion gun base 17, adjust a flow rate of a gas to be ionized, and supply the gas into the ion gun. Holes are formed in the ion gun base 17 and the cathode 11, and the argon gas introduced from the gas introduction mechanism 40 is introduced to the ionization chamber 18.

REFERENCE SIGNS LIST

1 Ion gun
2 Ion beam
3 Ion-gun control unit
4 Vacuum chamber
5 Vacuum pumping system
6 Sample
7 Sample support
8 Sample stage
9 Sample-stage driving unit
11 Cathode
12 Cathode
13 Anode
14 Permanent magnet
15 Acceleration electrode
16 Insulator
17 Ion gun base
18 Ionization chamber
21 Discharge power source
22 Acceleration power source 31 Anode inner diameter
32 Anode outlet hole
33 Cathode outlet hole
34 Acceleration-electrode outlet hole
40 Gas supply mechanism
41 Gas source
50 Current measurement unit
51 Current-probe driving unit
52 Current probe

The invention claimed is:

1. An ion milling device comprising:
an ion generator configured to cause electrons to collide with a gas supplied from an outside of the ion milling device and to generate ions; and
an acceleration electrode at which a voltage of 5 kV or more is applied as an electrode that accelerates the ions emitted from the ion generator, and that irradiates a sample with the accelerated ions so as to process the sample,
wherein the ion generator includes
a cathode from which the electrons are emitted;
an anode that is provided within the ion generator and has an inner diameter of 5.2 mm or less; and
a magnetic-field generator that generates a magnetic field within the ion generator by using a magnet having a maximum energy product ranging from 110 kJ/m$^3$ to 191 kJ/m$^3$.

2. The ion milling device according to claim 1,
wherein the magnet is a samarium-cobalt magnet.

3. The ion milling device according to claim 1,
wherein a voltage of 6 kV or more is applied at the acceleration electrode.

4. The ion milling device according to claim 1,
wherein the ion generator is a penning type.

5. The ion milling device according to claim 1,
wherein a residual magnetic flux density remaining in a permanent magnet of the magnetic-field generator in an absence of a voltage being present at said anode of the ion generator ranges from 810 mT to 950 mT.

6. The ion milling device according to claim 1,
wherein a holding force of the magnetic-field generator ranges from 620 mT to 660 mT.

7. The ion milling device according to claim 1,
wherein a shape of the anode is a cylindrical shape, and an inner diameter of the anode is the same as a diameter of an outlet hole of the anode.

8. The ion milling device according to claim 1,
wherein a diameter of an outlet hole of the anode is smaller than an inner diameter of the anode.

9. The ion milling device according to claim 8,
wherein the diameter of the outlet hole of the anode is 4 mm.

10. An ion source that is used in an ion milling device that includes an ion generator which causes electrons to collide with a gas supplied from an outside of the ion milling device and that generates ions, and an acceleration electrode at which a voltage of 5 kV or more is applied as an electrode that accelerates the ions emitted from the ion generator, and that irradiates a sample with the accelerated ions so as to process the sample, the ion source comprising:
a cathode from which the electrons are emitted;
an anode which is provided within the ion generator, and has an inner diameter of 5.2 mm or less; and
a magnetic-field generator that generates a magnetic field within the ion generator by using a magnet having a maximum energy product ranging from 110 kJ/m$^3$ to 191 kJ/m$^3$.

11. The ion source according to claim 10,
wherein the magnet is a samarium-cobalt magnet.

12. The ion source according to claim 10,
wherein a voltage of 6 kV or more is applied at the acceleration electrode.

13. The ion source according to claim 10,
wherein the ion source is a penning type.

14. The ion source according to claim 10,
wherein a residual magnetic flux density of a permanent magnet of the magnetic-field generator in an absence of a voltage being present at said anode of the ion generator ranges from 810 mT to 950 mT.

15. The ion source according to claim 10,
wherein a holding force of the magnetic-field generator ranges from 620 mT to 660 mT.

16. An ion milling device comprising:
an ion generator configured to cause electrons to collide with a gas supplied from an outside of the ion milling device and to generate ions; and
an acceleration electrode at which a voltage of 5 kV or more is applied as an electrode that accelerates the ions emitted from the ion generator, and that irradiates a sample with the accelerated ions so as to process the sample,
wherein the ion generator includes
a cathode from which the electrons are emitted;
an anode that is provided within the ion generator and has an inner diameter of 5.2 mm or less; and
a magnetic-field generator that generates a magnetic field on a central axis of the ion generator in a range of 140 mT to 160 mT.

17. The ion milling device according to claim 16,
wherein a voltage of 6 kV or more is applied at the acceleration electrode.

18. An ion milling method comprising:
an emission step of emitting electrons from a cathode;
an ion generation step of causing the electrons to collide with a gas supplied, from an outside of a milling device, on an inside of an anode having an inner diameter of 5.2 mm or less and generating ions;
a magnetic-field generation step of causing the ions to act on a magnetic field generated by a magnet having a maximum energy product ranging from 110 kJ/m$^3$ to 191 kJ/m$^3$;
an acceleration step of applying a voltage of 5 kV or more to the ions and accelerating the ions; and
a processing step of irradiating a sample with the accelerated ions so as to process the sample.

19. The ion milling method according to claim 18,
wherein the acceleration step is an acceleration step of applying a voltage of 6 kV or more to the ions and accelerating the ions.

20. The ion milling method according to claim 18,
wherein the magnetic-field generation step is a step of generating a magnetic field on a central axis of an ion generation unit in a range of 140 mT to 160 mT.

* * * * *